United States Patent [19]

Yamauchi

[11] Patent Number: 5,251,172
[45] Date of Patent: Oct. 5, 1993

[54] SEMICONDUCTOR MEMORY APPARATUS HAVING REDUCED AMOUNT OF BIT LINE AMPLIFICATION DELAY

[75] Inventor: Hiroyuki Yamauchi, Osaka, Japan

[73] Assignee: Matsushita Electric Industrial Co., Ltd., Osaka, Japan

[21] Appl. No.: 673,981

[22] Filed: Mar. 25, 1991

[30] Foreign Application Priority Data

Mar. 26, 1990 [JP] Japan ................................. 2-76023

[51] Int. Cl.⁵ .................... G11C 11/34; H01L 27/06
[52] U.S. Cl. ........................... 365/189.09; 365/189.06; 365/184; 365/208; 257/369
[58] Field of Search ............... 365/189.06, 189.09, 365/205-208, 174, 184; 307/296.1, 530; 257/369-371, 908-911

[56] References Cited

U.S. PATENT DOCUMENTS 4,233,672 11/1980 Suzuki et al. ................. 257/369 X
4,298,960 11/1981 Mitake et al. ................. 365/174 X
4,760,560 7/1988 Ariizumi et al. ............... 365/184 X
4,967,395 10/1990 Watanabe et al. ......... 365/189.06 X
5,161,121 11/1992 Cho ............................. 365/189.06

FOREIGN PATENT DOCUMENTS

0086559 4/1988 Japan ............................. 365/174

Primary Examiner—Robert J. Pascal
Assistant Examiner—Seung Ham
Attorney, Agent, or Firm—Lowe, Price, LeBlanc & Becker

[57] ABSTRACT

In a DRAM formed of MOS FETs, respectively different values of substrate bias voltage are applied to transistors of different types of circuit in accordance with the circuit functions, to thereby enable the threshold voltage of the transistors of the sense amplifiers to be brought close to zero, thereby reducing the bit line amplification delay, while maintaining sufficiently high values of threshold voltage for other circuits.

23 Claims, 7 Drawing Sheets

| | PRIOR ART | PRESENT INVENTION |
|---|---|---|
| FIG. 1 | $V_{CC1} = V_{CC2} = V_{CC3}$ | $V_{CC3} \geq V_{CC1} > V_{CC2}$ |
| FIG. 2 | $\|V_{BB1}\| = \|V_{BB2}\| = \|V_{BB3}\|$ | $\|V_{BB3}\| \geq \|V_{BB1}\| > \|V_{BB2}\|$ |
| FIG. 3 | $\|V_{BB1}\| = \|V_{BB2}\|$ $V_{CC1} = V_{CC2} = V_{CC3}$ | $\|V_{BB1}\| > \|V_{BB2}\|$ $V_{CC3} \geq V_{CC1} > V_{CC2}$ |
| FIG. 4 | $\|V_{BB1}\| = \|V_{BB2}\| = \|V_{BB3}\|$ $V_{CC1} = V_{CC2}$ | $\|V_{BB3}\| \geq \|V_{BB1}\| > \|V_{BB2}\|$ $V_{CC1} > V_{CC2}$ |

| | PRIOR ART | PRESENT INVENTION |
|---|---|---|
| FIG. 1 | $V_{CC1} = V_{CC2} = V_{CC3}$ | $V_{CC3} \geq V_{CC1} > V_{CC2}$ |
| FIG. 2 | $|V_{BB1}| = |V_{BB2}| = |V_{BB3}|$ | $|V_{BB3}| \geq |V_{BB1}| > |V_{BB2}|$ |
| FIG. 3 | $|V_{BB1}| = |V_{BB2}|$<br>$V_{CC1} = V_{CC2} = V_{CC3}$ | $|V_{BB1}| > |V_{BB2}|$<br>$V_{CC3} \geq V_{CC1} > V_{CC2}$ |
| FIG. 4 | $|V_{BB1}| = |V_{BB2}| = |V_{BB3}|$<br>$V_{CC1} = V_{CC2}$ | $|V_{BB3}| \geq |V_{BB1}| > |V_{BB2}|$<br>$V_{CC1} > V_{CC2}$ |

SEMICONDUCTOR MEMORY APPARATUS HAVING REDUCED AMOUNT OF BIT LINE AMPLIFICATION DELAY

BACKGROUND OF THE INVENTION

1. Field of the Invention

The present invention relates to a semiconductor memory apparatus, and in particular to a sense amplifier for a dynamic random access (DRAM) semiconductor memory apparatus which is formed of both p-channel and n-channel metal-oxide-silicon (MOS) transistors.

2. Description of the Related Art

In a DRAM semiconductor memory apparatus, sense amplifiers (which serve to detect and amplify small voltages that are produced on bit lines as a result of read-out of data from memory cells) are generally each configured in the form of a flip-flop circuit which is coupled to the lines of a bit line pair such as to be triggered into one of two possible directions in response to a small voltage change occurring on a bit line, to thereby amplify the voltage change. Such a flip-flop can be considered to consist of a pair of FETs having the gate electrodes respectively coupled to the lines of a bit line pair, the source electrodes respectively coupled to different lines of the bit line pair from the gate electrodes, and the source electrodes connected together at a common source node. Normally, the common source node is held at a voltage which will prevent triggering of the flip-flops, but when data read-out is to begin, the common source node is changed to a level which will permit triggering of the flip-flops in response to bit line voltage changes. However depending upon the polarity of a voltage change occurring on a bit line as a result of data read-out from a memory cell, the effective gate-to-source voltage that is applied to a transistor of a sense amplifier coupled to that bit line will differ. This can result in differing amounts of delay before amplification begins, since the common source node voltage is not immediately set to the level at which operation of the sense amplifiers can begin, but in practice will fall rather gradually with time, due to the effects of stray capacitance and supply lead resistance.

This bit line delay time problem is therefore a serious obstacle with regard to increasing the scale and element density of a DRAM semiconductor memory, and is a problem which has been difficult to overcome in the prior art.

SUMMARY OF THE INVENTION

It is an objective of the present invention to overcome the problem described above, by providing a semiconductor memory apparatus in which a reduction can be achieved in an amount of delay which occurs before sense amplifier amplification operation begins, after a memory cell read operation has been initiated. To achieve the above objective, the invention provides a semiconductor memory apparatus formed on a semiconductor substrate, including sense amplifier means for detecting and amplifying minute potential differences that are produced from memory cells of the semiconductor memory apparatus, wherein a threshold voltage of each of a plurality of first transistors which constitute the sense amplifier means is made smaller than a threshold voltage of a plurality of second transistors which constitute peripheral circuits of the semiconductor memory apparatus, and also smaller than a threshold voltage of a plurality of third transistors which constitute respective memory cells of the semiconductor memory apparatus.

More specifically, the invention provides a semiconductor memory apparatus in which transistors are formed as metal-oxide-silicon field effect transistors, and in which a first value of substrate bias voltage, of transistors of sense amplifier circuits for detecting and amplifying minute voltage differences read out from memory cells is made different from a second value of substrate bias voltage, of transistors of said memory cells and of transistors of peripheral circuits other that said sense amplifier circuits.

DESCRIPTION OF PREFERRED EMBODIMENTS

Before describing embodiments of the present invention, structures for a DRAM semiconductor memory apparatus that are common to both the prior art and the present invention will be described. As will be made clear in the following, the present invention differs from the prior art with respect to various potentials that are applied to a semiconductor substrate of the memory apparatus, and semiconductor regions referred to as "wells" that are formed in the substrate or are formed within other wells, rather than with respect to differences in structure. In the following, four types of memory apparatus structure will be discussed, which differ with regard to conduction type of the semiconductor substrate and the types of wells.

Figure 1:
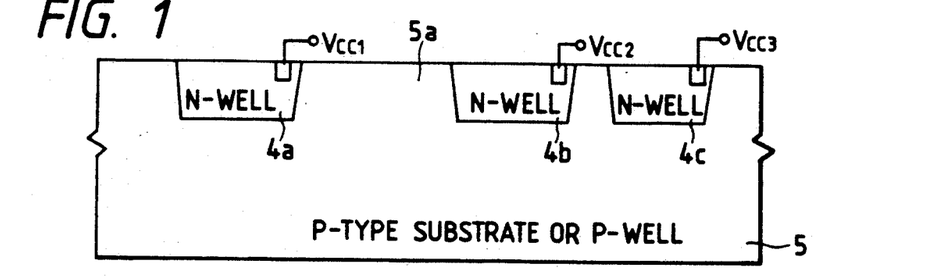
FIGS. 1 through 4 show respective cross-sectional view of portions of CMOS DRAM integrated circuits in which transistors are formed in respectively different substrate or well regions.

FIG. 1 shows a structure in which numeral 5 denotes a region that will be assumed for the purpose of description to be a substrate that is formed of p-type material, but which could be a well consisting of p-type material that is formed within an n-type substrate. A sense amplifier in a DRAM generally is formed of a combination of a p-type sense amplifier (consisting basically of pair of p-channel transistors coupled between a pair of bit lines, in a flip-flop configuration) and an n-type sense amplifier (similarly configured, but formed of n-channel transistors) connected between that pair of bit lines. In FIG. 1, it will be assumed that the transistors of a semiconductor memory apparatus are formed, as follows. For simplicity of description the formation of respective single transistors of a sense amplifier, memory cell, and peripheral circuits will be described, where each memory cell is formed of a transistor that is coupled to a capacitor for storing an amount of charge representing a "1" or "0" data bit, and where "peripheral circuits" signifies any other circuits than sense amplifiers or memory cells. As is well known, to form an n-channel MOS transistor in an n-type substrate it is necessary to first form a region referred to as a well, of p-type material in the n-type substrate, and to form the n-channel MOS transistor within that p-type well. Conversely, to form a p-channel MOS transistor in a p-type substrate it is necessary to first form a region (a well) of n-type material in the p-type substrate, and to form the p-channel MOS transistor within that n-type well. In FIG. 1, numeral 5 will be assumed to denote a p-type substrate, but could equally well denote a p-type well that is formed in an n-type substrate. In the manufacturing process, the n-type wells 4a, 4b and 4c are first formed within the upper part of the p-type substrate 5, then respective p-MOS transistors are formed in these wells, with a pmos transistor of peripheral circuits of the memory apparatus being formed in the n-type well 4a, a p-MOS transistor of a sense amplifier circuit being formed in the n-type well 4b, and p-MOS transistors of a memory cell (each memory cell being formed of a transistor coupled to a capacitor) being formed in the n-type well 4c, and with respective nmos transistors of the sense amplifier, of the peripheral circuits, and of the memory cells, being formed in a region 5a of the p-type substrate 5.

In the prior art, during operation of such a semiconductor memory apparatus, a fixed potential $V_{CC2}$ that is applied to the n-type well 4b, and fixed potentials $V_{CC1}$ and $V_{CC3}$ that are respectively applied to the n-type wells 4a and 4c, are all set at an identical value.

Figure 2:
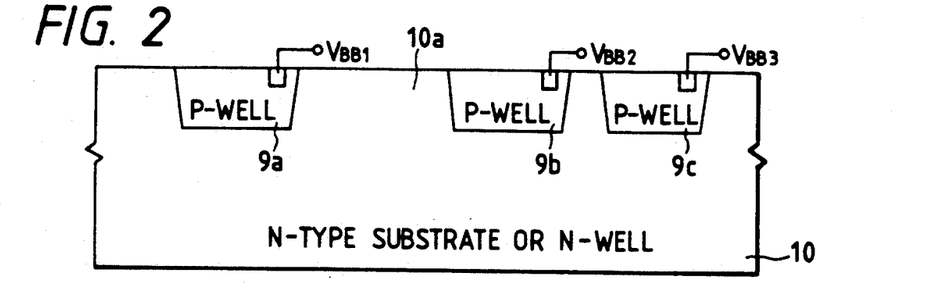

FIG. 2 shows a second example of a structure of a DRAM semiconductor memory apparatus. Numeral 10 denotes a region that will be assumed to be a substrate that is formed of n-type material, but which could be a well consisting of n-type material that is formed within a p-type substrate. In this case, firstly the p-type wells 4a, 4b and 4c are formed within the upper part of the n-type substrate 5, then respective n-channel MOS transistors are formed in these wells, with an nmos transistor of a circuit that is peripherally connected to the sense amplifier being formed in the p-type well 9a, an n-channel MOS transistor of a sense amplifier circuit being formed in the p-type well 9b, an n-channel MOS transistor of a memory cell being formed in the p-type well 9c, and with p-channel MOS transistors of the sense amplifier, of the peripheral circuits, and of the memory cells, being formed within a region 10a of the substrate 10.

In the prior art, during operation of such a semiconductor memory apparatus, a fixed potential $V_{BB2}$ that is applied to the p-type well 9b, and fixed potentials $V_{BB1}$ and $V_{BB3}$ that are respectively applied to the p-type wells 9a and 9c, are all set at an identical value.

Figure 3:
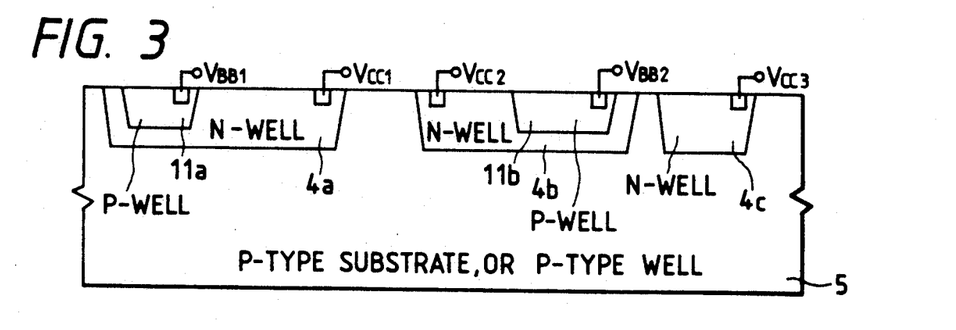

FIG. 3 shows another example of a structure for a DRAM semiconductor memory apparatus. In this case, a p-type substrate (or p-type well formed in an n-type substrate) 5 has formed in an upper region thereof an n-type well 4a, having a p-type well 11a formed therein. In addition, an n-type well 4b having a p-type well 11b formed therein, and an n-type well 4c, are also formed in the p-type substrate 5. In the n-type well 4a is formed a p-channel MOS transistor of the peripheral circuits, while a p-channel MOS transistor of a sense amplifier is formed in the n-type well 4b, a p-channel MOS transistor of a memory cell is formed in the n-type well 4c, n-channel MOS transistors of the peripheral circuits and the memory cells are formed in the p-type well 11a, and an n-MOS transistor of a sense amplifier is formed in the p-type well 11b.

During operation of a semiconductor memory apparatus having the structure of FIG. 3, in the prior art, the n-type well 4b in which a p-channel MOS transistor of a sense amplifier is formed is held at a fixed potential $V_{CC2}$ that is identical to each of fixed potentials $V_{CC1}$ and $V_{CC3}$ that are applied to the n-type wells 4a, 4c in which are formed the p-channel MOS transistors of the memory cells and the peripheral circuits. In addition, a fixed potential $V_{BB2}$ which is applied to the p-type well 11b in which is formed an n-channel MOS transistor of the sense amplifier is made identical to a fixed potential $V_{BB1}$ that is applied to the p-type well 11a in which are formed n-channel MOS transistors of the peripheral circuits and the memory cells.

Figure 4:
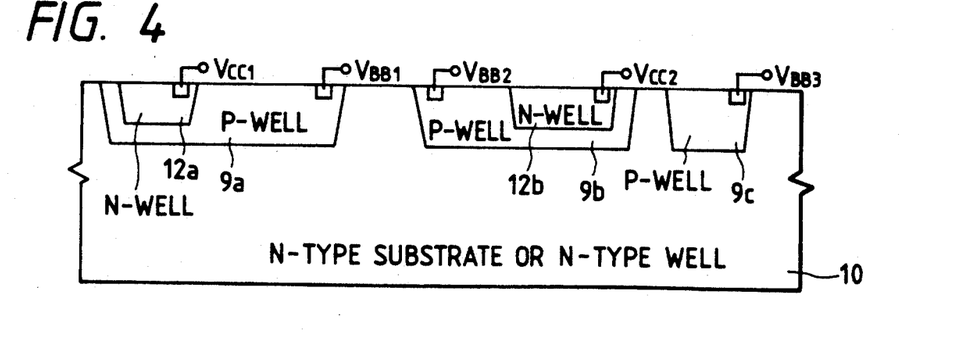

FIG. 4 shows another example of a structure for a DRAM semiconductor memory apparatus. In this case, an n-type substrate (or n-type well) 10 has formed in an upper region thereof a p-type well 9a, having an n-type well 12a formed therein. In addition, a p-type well 9b having an n-type well 12b formed therein, and a p-type well 9c, are also formed in the upper region of the n-type substrate 10. In the p-type well 9a is formed an n-channel MOS transistor of the peripheral circuits while an n-channel MOS transistor of a sense amplifier is formed in the p-type well 9b, an n-channel MOS transistor of a memory cell is formed in the p-type well 9c, p-channel MOS transistors of the peripheral circuits and the memory cells are formed in the n-type well 12a, and an n-channel MOS transistor of a sense amplifier is formed in the p-type well 9b.

During operation of a semiconductor memory apparatus having the structure of FIG. 4, in the prior art, the n-type well 9b in which an n-channel MOS transistor of the sense amplifier is formed is held at a fixed potential $V_{BB2}$ that is identical to each of fixed potentials $V_{BB1}$ and $V_{BB3}$ that are applied to the p-type wells 9a, 9c in which are formed the n-channel MOS transistors of the memory cells and the peripheral circuits. In addition, a fixed potential $V_{CC2}$ which is applied to the n-type well 12b in which is formed a p-channel MOS transistor of a sense amplifier is made identical to a fixed potential $V_{CC1}$ that is applied to the n-type well 12a in which are formed p-channel MOS transistors of the peripheral circuits and the memory cells.

In recent years there have been increasing demands for increased levels of element density within DRAMs, together with increased chip area, in order to achieve higher amounts of memory capacity. As a result, the lengths of various connecting leads within the memory chip are becoming greater, so that the effects of lead resistance in producing voltage drops are causing increasing problems. One of the most serious of these problems is that of increased delay time of sense amplifier operation. This problem will be described referring first to FIG. 5, in which for simplicity of description only the n-type sense amplifiers of a DRAM are shown. Each sense amplifier is 74 formed of a pair of n-channel MOS transistors, which are cross-coupled between a corresponding bit line pair 69 in a flip-flop configuration. Since the junctions of the source electrodes of the pairs of transistors forming the sense amplifiers 74 are all connected in common, the connection is referred to as a common source node, which is coupled through a supply lead 50 to a sense amplifier drive transistor 66. The supply lead 50 has significant values of resistance, which can be expressed as resistors 71. The switch transistor 66 is connected to a source of a drive voltage (in this example, ground potential) via a supply lead whose resistance is indicated by numeral 72. The sense amplifier portion of the DRAM is designated by numeral 60, while 61 denotes an array of memory cells, i.e. with the memory cells 68 being coupled to respective bit lines of the bit line pairs 69 as shown. It is assumed that there are a total of 1024 bit line pairs in this example. Each column of memory cells 68 is coupled to a corresponding word line 67 which controls read-out of data from all of the memory cells of that column.

The manner in which amplification delays are produced in the sense amplifier operation as a result of the resistances 71, 72 will be described referring to the waveform diagram of FIG. 6. Normally, each bit line is held at a fixed potential Vpre. When the potential of a word line 67 increases to a predetermined level, to initiate read-out from the memory cells of that word line, as shown by the word line waveform in FIG. 6, then a slight change in potential occurs on one bit line of each of the bit line pairs 69, as a result of charge transfer between the bit lines and the memory cells of that word line. These potential changes are shown as beginning at time point T0 in FIG. 6, and the amount and polarity of each of these potential changes is determined by the amount and polarity of the charge that has been previously been stored in the corresponding memory cell, i.e. in accordance with whether a "1" or a "0" logic value has been written into the memory cell. More specifically, if a potential of 0 V has been written into a memory cell, then a very small potential drop of $-\Delta V_L$ from the Vpre level will occur on a bit line that is coupled to that memory cell, with that potential drop beginning at time point T0. If on the other hand a potential of Vcc (V) has been written into a memory cell coupled to the word line 67, then a very small potential increase of $+\Delta V_H$ will occur on the bit line that is coupled to that memory cell. Thus there is a possibility that a condition will occur in which a potential difference of one of the values $\Delta V_H$ and $\Delta V_L$ will arise between one (or only a few) of the bit line pairs, while the other value arises between the remainder of the bit line pairs.

Figure 6:
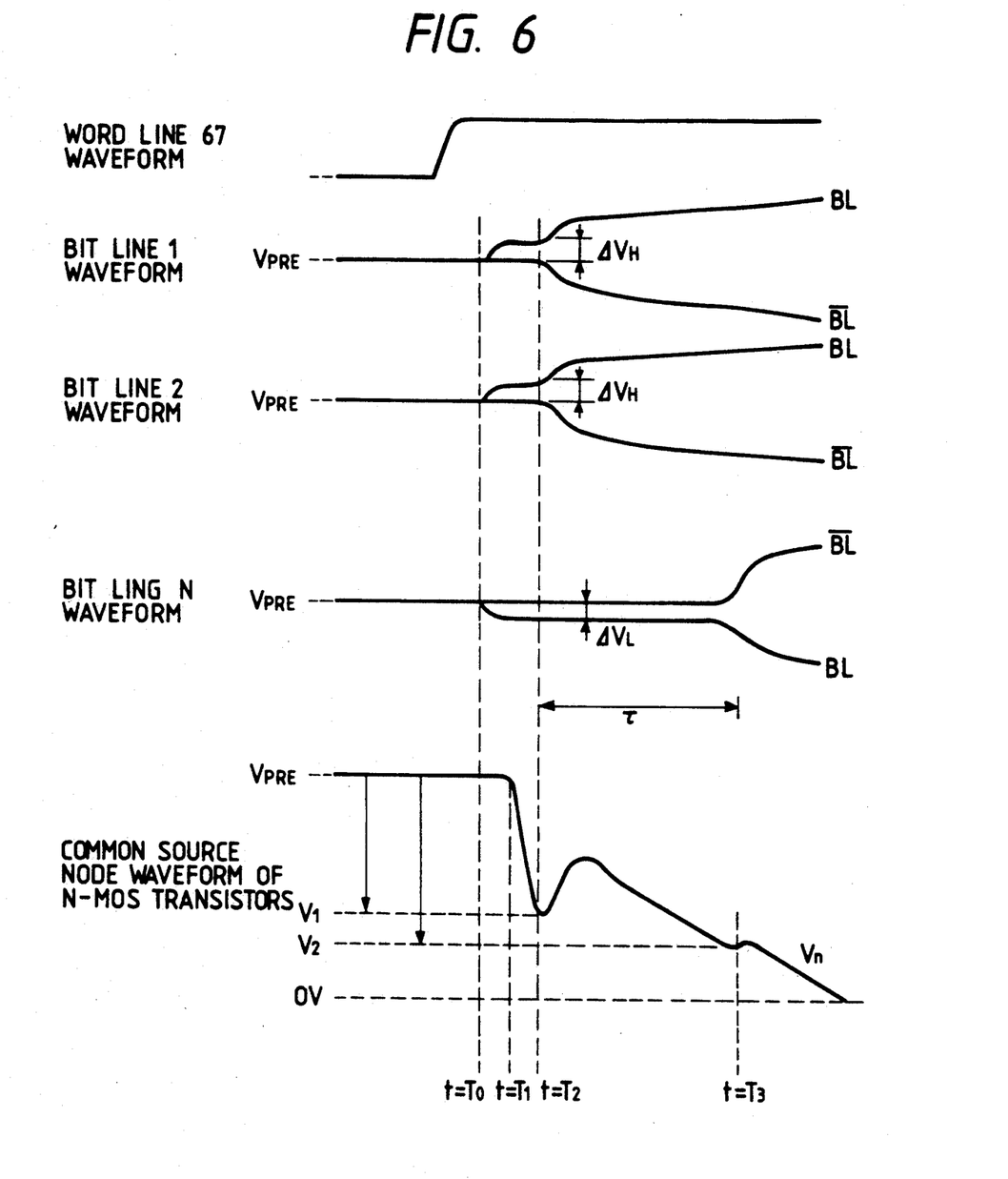
FIG. 6 is a waveform diagram illustrating sense amplifier operation and amplification delay in the circuit of FIG. 5.

In FIG. 6 it is assumed that of the total number n of bit line pairs 69, (e.g. 1024 bit line pairs), the small potential drop $-\Delta V_L$ arises on a bit line of one of these bit line pairs and that the small potential difference increase $\Delta V_H$ arises between each of the remaining (n−1) bit line pairs. When the drive transistor 66 is set in the ON (conducting) state at the time point T1 in FIG. 6 to thereby drive the sense amplifier circuits 74, the waveform of the voltage change at the common source node for one of the sense amplifiers 74 will be as shown, i.e. with the common source node voltage Vn initially falling sharply from the precharge potential Vpre towards 0 V, as the stray capacitance of the common source node supply lead 50 are discharged. At a time point T2, the common source node voltage has fallen from the value Vpre to a value V1 at which the sense amplifiers of the aforementioned (n−1) bit line pairs are set in the ON state. That is to say, considering a sense amplifier having a transistor whose gate electrode is coupled to a bit line which initially has increased by the amount $\Delta V_H$ as described above, there will be a common source node voltage level V1 such that the absolute value of potential difference (i.e. $V1 + \Delta V_H$) between the common source node and the gate of that transistor will exceed the transistor threshold voltage. Thus, for all of the (n−1) bit line pairs for which there was an initial potential increase of $\Delta V_H$, amplification of the bit line potential difference (due to triggering of the flip-flop constituted by the sense amplifier circuit) will begin at time point T2, when that common source node voltage level V1 is reached. Thus, (n−1) bit line pairs will now become connected to the common source node supply lead 50 at T2. As a result, the common source node voltage will temporarily increase towards the Vpre level after time point T2, (since, due to the lead resistances 71, 72 the supply lead 50 cannot immediately discharge the total of the stray capacitances of all of these (n−1) bit line pairs, which are all pre-charged to the Vpre potential). then will begin to gradually fall towards 0 V.

Considering now the single sense amplifier transistor whose gate electrode is coupled to the single bit line that has fallen by the amount $-\Delta V_L$, then when the common source node voltage reaches a certain value V2 at which the potential difference between the gate of that transistor and the common source node has reached the transistor threshold voltage, amplification by that sense amplifier will begin. However in that case, the absolute value of that potential difference will be $(V2 - V_H)$, so that the value V2 must be more negative than V1. That is to say, there will be a delay time $\tau$, (which is the time taken for the common source node voltage to fall from the value V1 to V2) before amplification by the sense amplifier that is coupled to that single bit line pair (whose initial potential difference was $-\Delta V_H$) begins, after amplification by all of the other (n−1) sense amplifiers has begun.

Figure 5:
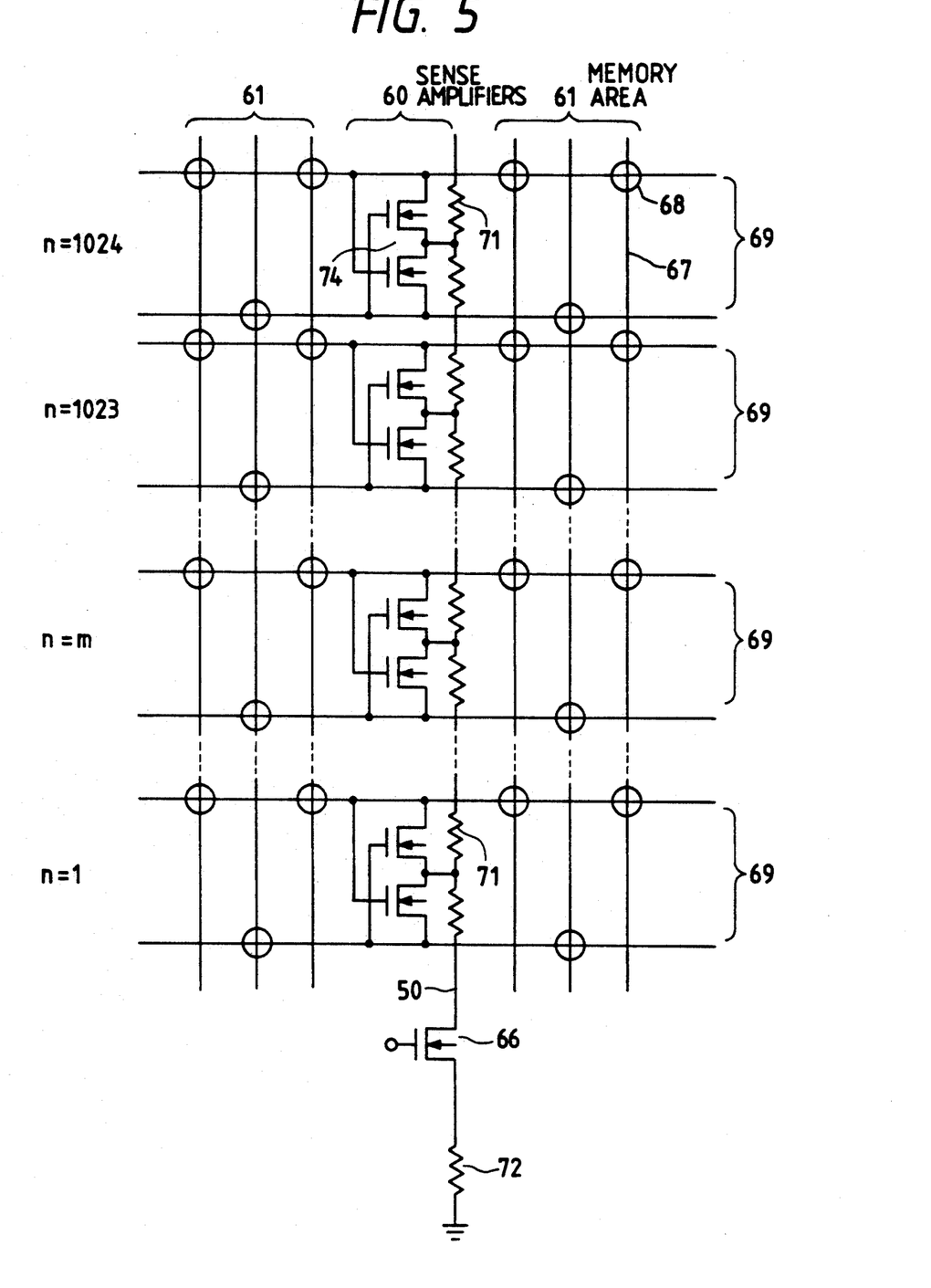
FIG. 5 is a circuit diagram of part of a DRAM circuit, for describing the effects of connecting lead resistance and stray capacitance upon bit line amplification delay times.

This phenomenon whereby the delay time $\tau$ can occur between the start of amplification by some sense amplifiers, by comparison with the start of amplification by other sense amplifiers after a memory read-out operation has been initiated, is a serious problem. It will be apparent that the problem will become increasingly severe as the scale of a DRAM chip is increased. That is to say, an increase in the length and number of memory cells of each bit line will result in an increase in the bit line stray capacitance, thus causing an increase in the delay time. Similarly, an increase in the length of each common source node supply lead 50 will result in a greater level of resistance 71, thereby causing an increase in the time required to charge the stray bit line capacitances after sense amplifier amplification begins. Furthermore, an increase in the number of bit line pairs that are connected via sense amplifiers to a common source node supply lead will result in an increase in the amount of stray capacitance that must be discharged by current flow through the supply lead when amplification begins, so that the problem of the delay time is further aggravated.

Furthermore, as a result of the tendency towards increased element density in DRAM memory chips, the extremely small transistors are now formed in regions of submicron size. Thus, in order to control the short channel effect, it is necessary to use a high impurity concentration in forming the substrate, so that a high level of substrate bias is necessary. This results in high values of transistor threshold voltage. As will be clear from the above description, the time required for the voltage levels V1 and V2 (at which sense amplifier amplification begins) to be reached will be increased if there is an increase in the threshold voltage of the transistors which constitute the sense amplifiers. Thus the bit line delay problem is further worsened as a result of increased miniaturization of the transistor elements of a DRAM memory.

It is therefore desirable to provide a low value of threshold voltage for the transistors which constitute the sense amplifiers in a DRAM. If the threshold voltage of all of the transistors which constitute such a memory were to be reduced, this would lead to problems in peripheral circuits of the memory, i.e. circuits other than the sense amplifiers. That is to say, an excessive degrre of reduction in threshold voltage of the transistors of such circuits will result in increased errors in operation, due to the effects of noise, and may also lead to excessive levels of leakage current in these transistors. Thus it is not practicable to significantly reduce the threshold voltage of all of the MOS transistors of a DRAM circuit.

However it is known that it is possible to alter the threshold voltage of a MOS FET, in actual operation, by altering a level of bias voltage applied to the substrate or well in which the FET is formed (more precisely, by altering a level of reverse bias that is applied between the source and substrate of the FET). An increase in the level of that bias voltage results in an increase in the FET threshold voltage (that is to say, the threshold voltage becomes more negative, in the case of a p-channel MOS transistor, and becomes more positive, in the case of an n-channel MOS transistor, as the level of substrate bias voltage is increased).

A first embodiment of a semiconductor memory apparatus according to the present invention will be described, which employs such a relationship between substrate bias and threshold voltage, in a structure of the form shown in FIG. 1 and described hereinabove. This differs from the prior art in that the voltage $V_{CC2}$ that is applied to each n-type well 4b in which a p-channel MOS transistor of a sense amplifier is formed, the voltage $V_{CC1}$ applied to each n-type well 4a of a p-channel MOS transistor of the peripheral circuits, and the voltage $V_{CC3}$ that is applied to each n-type well 4c of a p-channel MOS transistor of a memory cell are made mutually different and in that the following relationship is established between the respective magnitudes these three voltages:

$$V_{CC3} \geq V_{CC1} > V_{CC2}$$

Typical values could be, for example, $V_{CC3}=5$ V, $V_{CC1}=4$ V, and $V_{CC2}=3$ V.

As a result, the value of threshold voltage $Vt_{cel}$ of the p-channel MOS transistors of the memory cells, the threshold voltage $Vt_{peri}$ of the p-channel MOS transistors of the peripheral circuits, and the threshold voltage $Vt_{sa}$ of the p-channel MOS transistors of the sense amplifiers are related in the following manner:

$$|Vt_{cel}| \geq |Vt_{peri}| > |Vt_{sa}|$$

In this way, the threshold voltage of the p-channel MOS transistors of the sense amplifiers is made smaller than the threshold voltages of the other p-channel MOS transistors of the DRAM, while the threshold voltage of the p-channel MOS transistors of the peripheral circuits is made smaller than the threshold voltage of the p-channel MOS transistors of the memory cells. As described above, a low value of threshold voltage is desirable for the sense amplifier transistors, while a relatively high value of threshold voltage is desirable for the transistors of the memory cells, since this will ensure a low level of leakage current from each cell and so ensure that the amount of charge that is stored in the capacitor of each memory cell will be preserved to a sufficient degree.

A second embodiment of the invention will be described, which uses the structure of FIG. 2 described above. This differs from the prior art in that the voltage $V_{BB2}$ that is applied to each p-type well 9b in which an n-channel MOS transistor of a sense amplifier is formed, the voltage $V_{BB1}$ applied to each p-type well 9a of an n-channel MOS transistor of the peripheral circuits, and the voltage $V_{BB3}$ that is applied to each p-type well 9c of an n-channel MOS transistor of a memory cell are made mutually different and in that the following relationship is established between the respective magnitudes these three voltages:

$$|V_{BB3}| \geq |V_{BB1}| > |V_{BB2}|$$

Typical values for these voltages might be, for example, $V_{BB3}=-4$ V, $V_{BB1}=-2$ V, and $V_{BB2}=0$ V.

As a result, the value of threshold voltage $Vt_{cel}$ of the n-channel MOS transistors of the memory cells, the threshold voltage $Vt_{peri}$ of the n-channel MOS transistors of the peripheral circuits, and the threshold voltage $Vt_{sa}$ of the n-channel MOS transistors of the sense amplifiers are related in the following manner:

$$|Vt_{cel}| \geq |Vt_{peri}| > |Vt_{sa}|$$

In this way, the threshold voltage of the n-channel MOS transistors of the sense amplifiers is made smaller than the threshold voltages of the other n-channel MOS transistors of the DRAM, while the threshold voltage of the n-channel MOS transistors of the peripheral circuits is made smaller than the threshold voltage of the n-channel MOS transistors of the memory cells.

A third embodiment of the invention will be described, which utilizes the structure of FIG. 3, described hereinabove. With this embodiment, the potential $V_{CC2}$ that is applied to the n-type well 4b in which a p-channel MOS transistor of a sense amplifier is formed, and the potentials $V_{CC1}$ and $V_{CC3}$ that are respectively applied to the n-type wells 4a, 4c in which are formed the p-channel MOS transistors of the memory cells and the peripheral circuits, are set to respectively different values which are related as follows:

$$V_{CC3} \geq V_{CC1} > V_{CC2}$$

As a result, the value of threshold voltage $Vt_{cel}$ of the p-channel MOS transistors of the memory cells, the threshold voltage $Vt_{peri}$ of the p-channel MOS transistors of the peripheral circuits, and the threshold voltage $Vt_{sa}$ of the p-channel MOS transistors of the sense amplifiers are related in the following manner:

$$|Vt_{cel}| \geq |Vt_{peri}| > |Vt_{sa}|$$

In addition, the voltage $V_{BB2}$ which is applied to each p-type well 11b (formed within an n-type well 4b) in which is formed an n-channel MOS transistor of the sense amplifier, and the voltage $V_{BB1}$ that is applied to each p-type well 11a (formed in an n-type well 4a) in which are formed n-channel MOS transistors of the peripheral circuits and the memory cells, are set to respective values that are related as follows:

$$|V_{BB1}| > |V_{BB2}|$$

As a result, the value of threshold voltage $Vt_{peri}$ of the n-channel MOS transistors of the peripheral circuits, and the threshold voltage $Vt_{sa}$ of the n-channel MOS transistors of the sense amplifiers are related in the following manner:

$$|Vt_{peri}| > |Vt_{sa}|$$

A fourth embodiment of the invention will be described, which utilizes the structure of FIG. 4, described hereinabove. With this embodiment, the potential $V_{BB2}$ that is applied to the n-type well 9b in which a p-channel MOS transistor of a sense amplifier is formed, and the potentials $V_{BB1}$ and $V_{BB3}$ that are respectively applied to the n-type wells 9a, 9c in which are formed the p-channel MOS transistors of the memory cells and the peripheral circuits, are set to respectively different values which are related as follows:

$$|V_{BB3}| \geq |V_{BB1}| > |V_{BB2}|$$

As a result, the value of threshold voltage $Vt_{cel}$ of the n-channel MOS transistors of the memory cells, the threshold voltage $Vt_{peri}$ of the n-channel MOS transistors of the peripheral circuits, and the threshold voltage $Vt_{sa}$ of the n-channel MOS transistors of the sense amplifiers are related in the following manner:

$$|Vt_{cel}| \geq |Vt_{peri}| > |Vt_{sa}|$$

In addition, the voltage $V_{CC2}$ which is applied to each n-type well 12b (formed within a p-type well 9b) in which is formed a p-channel MOS transistor of the sense amplifier, and the voltage $V_{CC1}$ that is applied to each n-type well 12a (formed in a p-type well 9a) in which are formed p-channel MOS transistors of the peripheral circuits and the memory cells, are set to respective values that are related as follows:

$$V_{CC1} > V_{CC2}$$

As a result, the value of threshold voltage $Vt_{peri}$ of the p-channel MOS transistors of the peripheral circuits, and the threshold voltage $Vt_{sa}$ of the p-channel MOS transistors of the sense amplifiers are related in the following manner:

$$|Vt_{peri}| > |Vt_{sa}|$$

It can be understood from the above that each of the four embodiments of the present invention, which enable the respective values of threshold voltage used in different type of circuit to be selectively set to appropriate values, can provide a significant improvement in DRAM operation. The threshold voltage of the transistors of the sense amplifiers can be set close to 0 V, to thereby overcome the problem of bit line amplification delay time. Furthermore, the threshold voltage of the transistors of the memory cells can be made relatively high, to thereby reduce the level of leakage current of these transistors and ensure stable storage in the cells of amounts of charge representing data. Moreover, the threshold voltage of the transistors which constitute peripheral circuits (i.e. circuits other than the memory cells or the sense amplifiers, such as drive circuits) can be made sufficiently high to ensure that there will be a low level of leakage current during standby operation of the DRAM, and to prevent erroneous operation due to the effects of electrical noise, while also ensuring that (in the case of drive transistors) a high degree of current drive performance can be achieved, with a low level of power loss.

Figure 7:
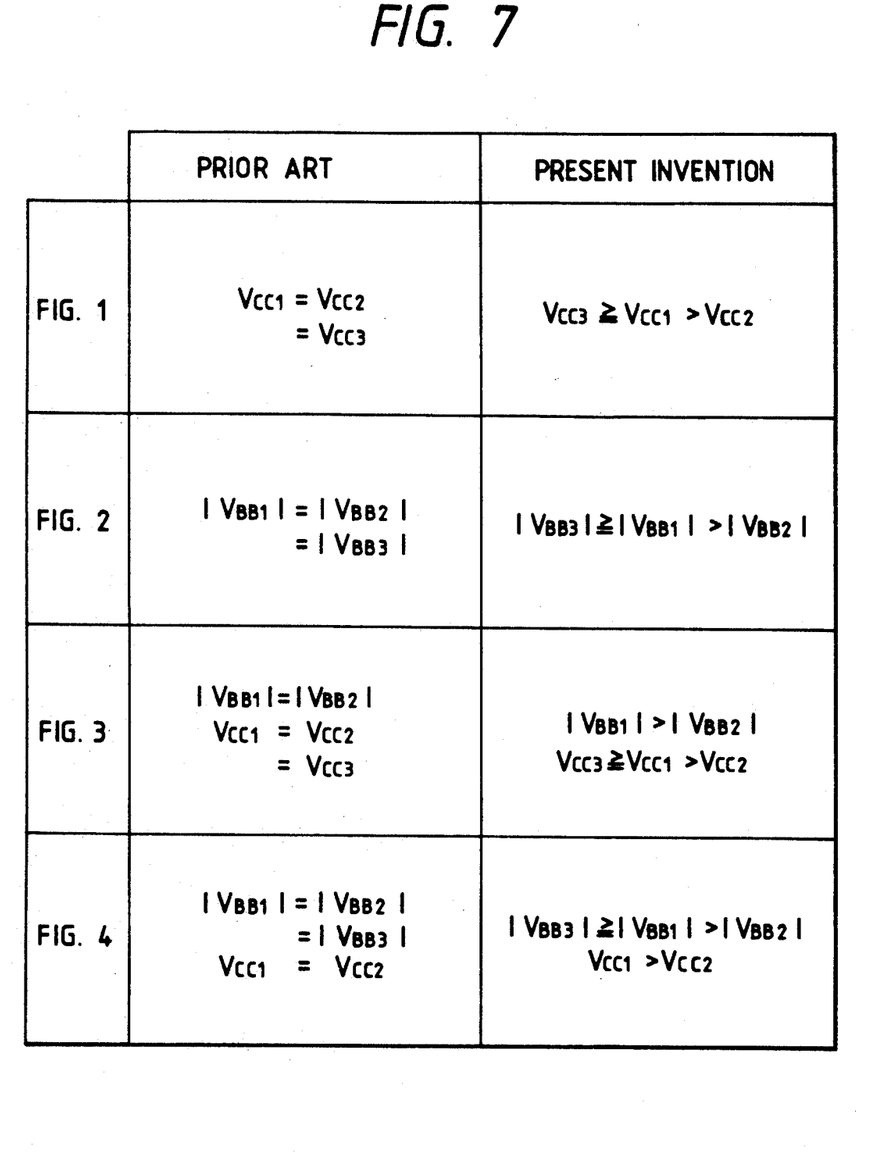
FIG. 7 is a table showing relationships between values of threshold voltage in a prior art DRAM and in a DRAM according to the present invention.

The relationships between the bias voltages $V_{BB1}$, $V_{CC1}$ etc. in a prior art semiconductor memory and the corresponding relationships for each of the first through fourth embodiments of the present invention, as described hereinabove, are set out in the table of FIG. 7.

Figure 8:
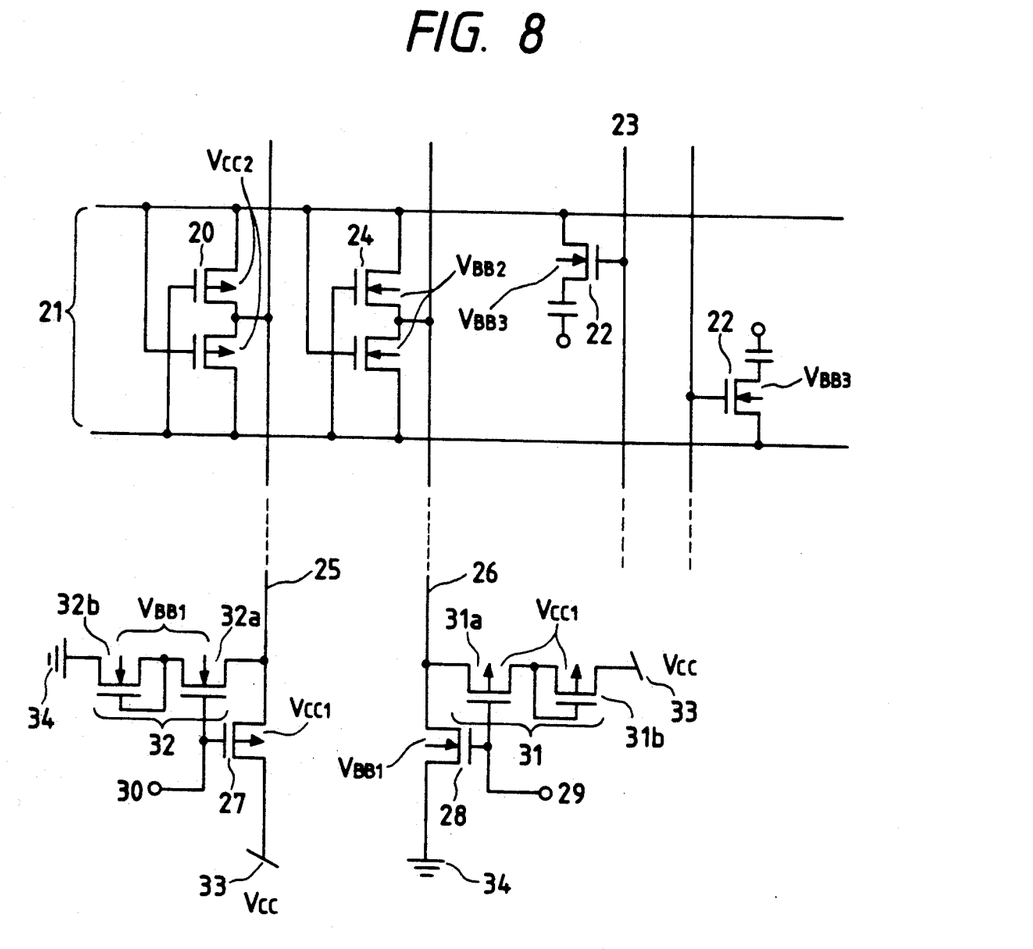
FIG. 8 is a circuit diagram of part of a DRAM, showing a circuit for applying a bias voltage to each sense amplifier transistor to hold each transistor in a cut-off state, even if the threshold voltage of the transistors is close to zero.

A circuit will now be described, referring to FIG. 8, whereby the transistors of the sense amplifiers of a DRAM can be held in the cut-off state during standby operation, even if the threshold voltage of these transistors has been brought close to 0 V. With the circuit of FIG. 8, numeral 21 denotes a bit line pair, 20 denotes a sense amplifier flip-flop circuit that is formed of p-channel MOS transistors, 24 denotes a sense amplifier flip-flop circuit that is formed of n-channel MOS transistors. The bias voltages applied to the substrate (or well) in which are formed the transistors of the flip-flop circuit 20 is $V_{CC2}$, while the corresponding voltage for the flip-flop circuit 24 is $V_{BB2}$. Each memory cell 22 is formed of an n-channel MOS transistor coupled to a capacitor, with the substrate (or well) bias voltage of the memory cell transistors being $V_{BB3}$. 27 denotes a drive transistor for driving the p-channel MOS transistor flip-flop circuits 20 via a common mode supply lead 25, with the transistor 27 being a p-channel MOS transistor having a substrate (or well) bias voltage of $V_{CC1}$. 28 denotes a drive transistor for driving the n-channel MOS transistor flip-flop circuits 24 via a common mode supply lead 26, with the transistor 28 being an n-channel MOS transistor having a substrate (or well) bias voltage of $V_{BB1}$. When the drive transistor 27 is set in the ON state, it supplies the Vcc supply voltage to the common source node supply lead 25, and when the drive transistor 28 is set in the ON state it supplies the 0 V (ground potential) supply voltage to the common source node supply lead 26. A clamping circuit 32 is formed of two n-channel MOS transistors 32a, 32b connected in series between the common source node supply lead 25 and ground potential, with the gate and drain electrodes of the transistor 32b being connected together. A control lead 30 is connected to the gate electrodes of the drive transistor 27 and the transistor 32a. Similarly, a clamping circuit 31 is formed of two p-channel MOS transistors 31a, 31b connected in series between the common source node supply lead 26 and the Vcc supply potential, with the gate and drain electrodes of the transistor 31b being connected together. A control lead 29 is connected to the gate electrodes of the drive transistor 28 and the transistor 31a. Control signals for the drive transistors 27, 28 are applied to the control leads 30, 29 respectively.

The magnitude relationships between the substrate (or well) bias voltages $V_{CC1}$, $V_{CC2}$, $V_{BB1}$, $V_{BB2}$, $V_{BB3}$, are in accordance with the fourth embodiment of the embodiment described above, i.e.:

$$|V_{BB3}| \geq |V_{BB1}| > |V_{BB2}|$$

$$V_{CC1} > V_{CC2}$$

The operation of this circuit is as follows. When the control leads 30 and 29 are respectively set to low (L) and high (H) potentials, the drive transistors 27, 28 for the p-channel flip-flops 20 and n-channel flip-flops 24 are both set in the ON state, while when the control leads 29 and 30 are respectively set to L and H potentials, the drive transistors 27, 28 are both set in the OFF state. In that OFF state of the transistors 27, 28, the clamping circuits 31, 32 are both in the ON state, so that the common source node drive leads 25 and 26 are respectively set to potentials of Vtn and (Vcc−Vtp), where Vtn and Vtp are the threshold voltages of the transistors of the clamping circuits 32 and 31 respectively.

In this way, the potential of the common source node supply lead 25 is clamped at a value that is less than Vcc/2, i.e. a value that is less than the precharge voltage level Vpre of the bit line pair 21, while the potential of the common source node supply lead 26 is similarly clamped at a value that is higher than Vcc/2. Thus, a bias voltage is applied between the source and gate electrodes of each of the transistors of the sense amplifiers, with a polarity ensuring that each transistor is held in the cut-off state.

Figure 9:
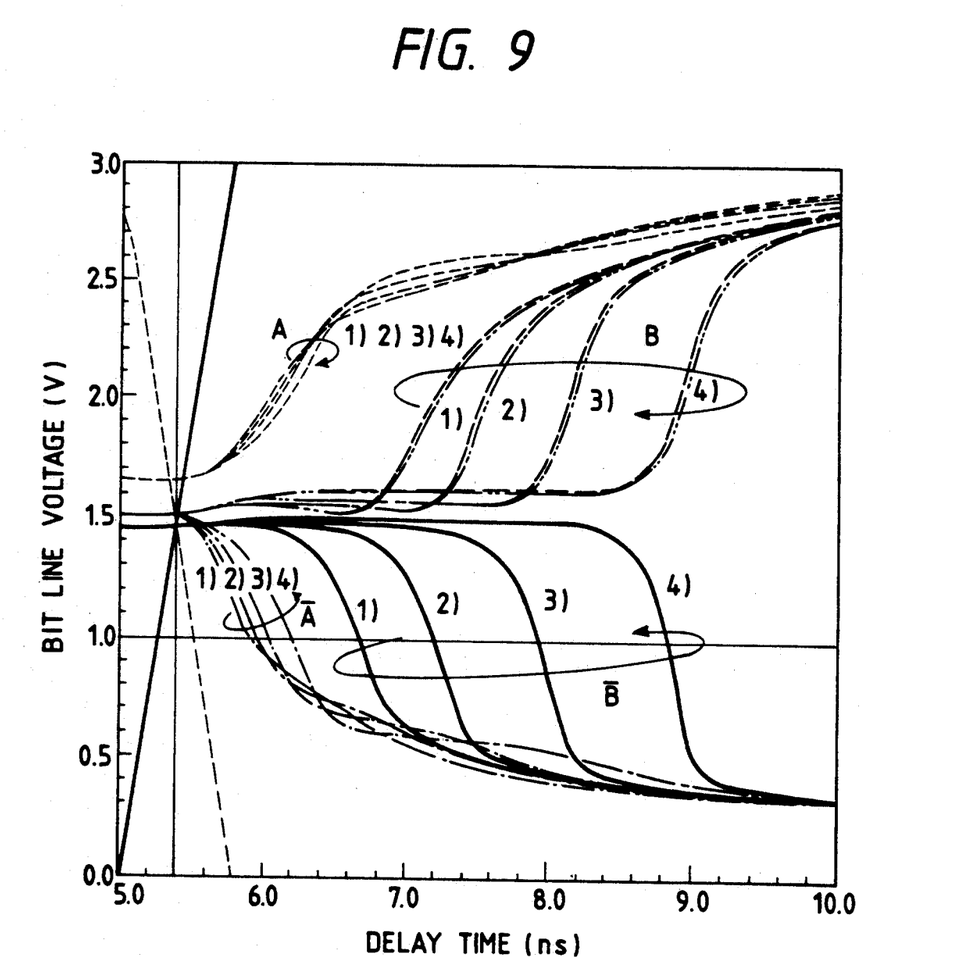
FIGS. 9 and 10 are graphs showing results of simulation of the effects of changes in threshold voltage of sense amplifier transistors upon the amount of amplification delay.

FIG. 9 shows the results obtained by computer simulation that was executed to show the effects of changes in the level of threshold voltage of the sense amplifier transistors of a DRAM upon bit line amplification delay, for the case of a 16 Mbit DRAM. In the simulation it was assumed that the bit line capacitance is 300 fF, the sense amplifier supply voltage Vcc is 3.0 V, and that the number of sense amplifiers N=1024. It is also assumed that the sense amplifier circuit is a flip-flop circuit formed of n-channel MOS transistors, and that the threshold voltage Vt of the sense amplifier mos transistors is changed from 0.3 V to approximately 0.9 V.

A worst-case condition of bit line amplification delay is simulated, i.e. the condition described hereinabove referring to FIG. 6, in which a small voltage difference of $\Delta V_H$ is produced following the start of a read-out operation (i.e. from time T0 in FIG. 6) between a total of (N−1) bit line pairs, while a small voltage difference of $-\Delta V_L$ is produced between one of the bit line pairs. In FIG. 9, A and $\overline{A}$ denote bit line waveforms for one of the (N−1) bit line pairs in which the voltage difference $V_H$ is initially produced, while B and $\overline{B}$ show the waveforms for the bit line pair in which the voltage difference $-\Delta V_L$ is initially produced. The designations 1), 2), 3) and 4) for the waveforms A, $\overline{A}$ and B, $\overline{B}$ indicate the respective values of threshold voltage Vt corresponding to the waveforms, these threshold voltage values being respectively 0.3 V, 0.5 V, 0.7 V and 0.9 V. It can be seen that the amplification delay of the waveforms B, $\overline{B}$ increases in accordance with increased values of sense amplifier transistor threshold voltage, thus confirming the relationship described hereinabove with reference to FIG. 6.

Figure 10:
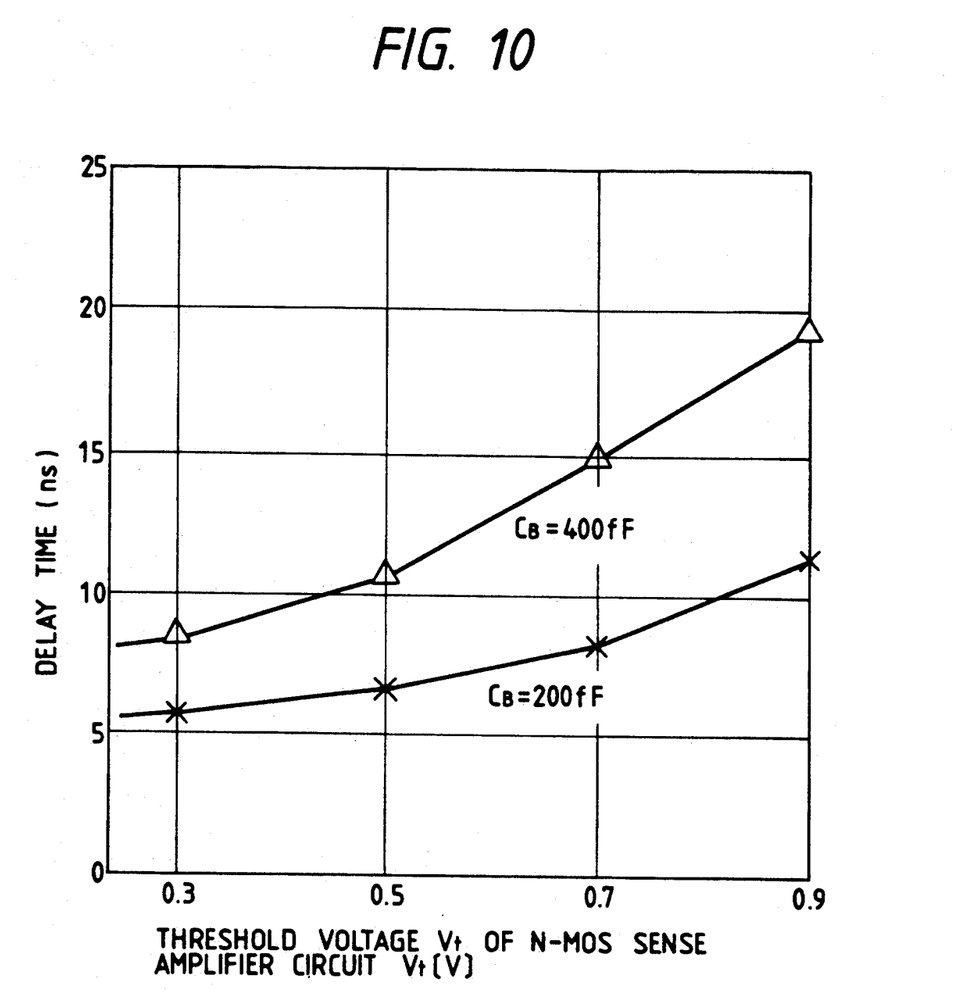

FIG. 10 shows the relationship between the time taken for a bit line voltage difference to be amplified to a value of 1.5 V and the threshold voltage of the sense amplifier transistors, for the cases of the bit line capacitance $C_B$ being 200 fF and 400 fF respectively, obtained by computer simulation.

It can thus be understood from the above simulation results that it is possible to reduce the bit line amplification delay in a DRAM by reducing the value of threshold voltage of the transistors which constitute the sense amplifiers of the DRAM. It can further be understood that each of the four embodiments of the present invention described hereinabove enables the respective threshold voltages of MOS FETs of a DRAM to be set to optimum values in accordance with the circuit functions of the transistors, by bias voltages that are applied to the circuits. Thus the invention enables bit line amplification delay to be reduced by minimizing the value of threshold voltage of the MOS FETs constituting the sense amplifiers of a DRAM, to thereby provide a significant improvement in performance of the DRAM.

In the appended claims, the term "substrate bias voltage" of a transistor is used in the generally accepted sense in MOS technology, to signify the bias voltage that is applied to a bulk semiconductor region in which a MOS field effect transistor is formed, irrespective of whether that region is an integrated circuit substrate, a well that is formed within a substrate, or a well that is formed within a larger well.

What is claimed is:

1. A semiconductor memory apparatus comprising a plurality of memory cells and a plurality of sense amplifiers, said sense amplifiers being respectively coupled to amplify voltage differences read out from said memory cells, and a plurality of peripheral circuits being circuits other than said memory cells and said sense amplifiers, wherein said memory cells, said sense amplifiers and said peripheral circuits each comprise transistors; and circuit means for providing an absolute value of threshold voltage of said transistors of the sense amplifiers is smaller than an absolute value of threshold voltage of said transistors of the memory cells and smaller than an absolute value of threshold voltage of said transistors of the peripheral circuits.

2. A semiconductor memory apparatus according to claim 1, wherein all of said transistors of said memory cells, sense amplifiers and peripheral circuits comprise respective metal-oxide-silicon field effect transistors, a first value of substrate bias voltage is applied to each of said transistors of the sense amplifiers, a second value of substrate bias voltage is applied to each of said transistors of the memory cells, and a third value of substrate bias voltage is applied to each of said transistors of the peripheral circuits; and wherein said first value of substrate bias voltage is different from each of said second and third values of substrate bias voltage.

3. A semiconductor memory apparatus according to claim 2, wherein said transistors of the sense amplifiers, said transistors of the memory cells and said transistors of the peripheral circuits are in respective p-type wells (9b, 9c, 9a), and wherein said first value of substrate bias voltage ($V_{BB2}$) is made higher than each of said second and third values of substrate bias voltage ($V_{BB3}$, $V_{BB1}$).

4. A semiconductor memory apparatus according to claim 2, wherein said transistors of the sense amplifiers, said transistors of the memory cells, and said transistors of the peripheral circuits are in respective n-type wells (4b, 4c, 4a), and wherein said first value of substrate bias voltage ($V_{CC2}$) is made lower than each of said second and third values of substrate bias voltage ($V_{CC3}$, $V_{CC1}$).

5. A semiconductor memory apparatus according to claim 2, wherein said second value of substrate bias voltage is different from said third value of substrate bias voltage, such as to establish a lower absolute value of threshold voltage for said transistors of the sense amplifiers than for said transistors of the peripheral circuits.

6. A semiconductor memory apparatus according to claim 5, wherein said transistors of the sense amplifiers, said transistors of the memory cells and said transistors of the peripheral circuits are in respective p-type wells (9b, 9c, 9a), wherein said first value of substrate bias voltage ($V_{BB2}$) is higher than said third value of substrate bias voltage ($V_{BB1}$), and wherein said third value of substrate bias voltage ($V_{BB1}$) is higher than said second value of substrate bias voltage ($V_{BB3}$).

7. A semiconductor memory apparatus according to claim 5, wherein said transistors of the sense amplifiers, said transistors of the memory cells and said transistors of the peripheral circuits are formed in respective n-type wells (4b, 4c, 4a), wherein said first value of substrate bias voltage ($V_{CC2}$) is lower than said third value of substrate bias voltage ($V_{CC1}$), and wherein said third value of substrate bias voltage ($V_{CC1}$) is lower than said second value of substrate bias voltage ($V_{CC3}$).

8. A semiconductor memory apparatus according to claim 1, wherein all of said transistors of said memory cells, sense amplifiers and peripheral circuits comprise respective metal-oxide-silicon field effect transistors, each of said sense amplifiers including a first transistor in a p-type well (11b) and a second transistor in an n-type well (4b), each of said peripheral circuits including a first transistor in a p-type well (11a) and a second transistor in an n-type well (4a), and each of said memory cells having a transistor in an n-type well (4c); and
wherein a value of substrate bias voltage ($V_{CC2}$) applied to said n-type well (4b) of said second transistor of a sense amplifier is lower than a value of substrate bias voltage ($V_{CC3}$) applied to said n-type well (4c) of said transistor of a memory cell, and lower than a value of substrate bias voltage ($V_{CC1}$) applied to said n-type well (4a) of said second transistor of a peripheral circuit, and wherein a value of substrate bias voltage ($V_{BB2}$) applied to said p-type well (11b) of said first transistor of a sense amplifier is higher than a value of substrate bias voltage (VBB1) applied to said p-type well (11a) of said first transistor of a peripheral circuit.

9. A semiconductor memory apparatus according to claim 1, wherein all of said transistors of said memory cells, sense amplifiers and peripheral circuits comprise respective metal-oxide-silicon field effect transistors, each of said sense amplifiers including a first transistor in an n-type well (12a) and a second transistor in a p-type well (9b), each of said peripheral circuits including a first transistor in an n-type well (12a) and a second transistor in a p-type well (9a), and each of said memory cells having a transistor in a p-type well (9c); and
wherein a value of substrate bias voltage ($V_{BB2}$) applied to said p-type well (9b) of said second transistor of a sense amplifier is higher than a value of substrate bias voltage ($V_{BB3}$) applied to said p-type well (9c) of said transistor of a memory cell, and higher than a value of substrate bias voltage ($V_{BB1}$) applied to said p-type well (9a) of said second transistor of a peripheral circuit, and wherein a value of substrate bias voltage ($V_{CC2}$) applied to said n-type well (12b) of said first transistor of a sense amplifier is lower than a value of substrate bias voltage ($V_{CC1}$) applied to said n-type well (12a) of said first transistor of a peripheral circuit.

10. A semiconductor memory apparatus including a plurality of memory cells connected to respective pairs of bit lines, a plurality of sense amplifiers each comprising metal-oxide-silicon field effect transistors, each of said metal-oxide-silicon field effect transistors having a gate electrode connected to a first line of one of said bit line pairs and a drain electrode connected to a second line of said one of the bit line pairs, a common mode supply lead connected in common to respective source electrodes of said metal-oxide-silicon field effect transistors, drive means controllable for connecting said common mode supply lead to a supply voltage, said bit lines being set in common at a fixed precharge voltage other than during intervals in which said common mode supply lead is connected to said supply voltage; and
circuit means for clamping said common mode supply lead at a fixed voltage level other than during intervals in which said drive means is controlled to connect said common mode supply lead to said supply voltage, said fixed voltage level being selected such as to differ from said fixed precharge voltage by an amount and polarity such that each of said metal-oxide-silicon field effect transistors is held in a cut-off state.

11. A semiconductor memory apparatus according to claim 10, wherein said memory cells and said drive means include respective metal-oxide-silicon field effect transistors, and wherein said circuit means comprises additional means for making an absolute value of threshold voltage of said transistors of the sense amplifiers is smaller than an absolute value of threshold voltage of said transistors of the memory cells and smaller than an absolute value of threshold voltage of said transistors of the drive means.

12. A semiconductor memory apparatus including metal-oxide-silicon field effect transistors, and means for making a first value of substrate bias voltage, of transistors of sense amplifier circuits for detecting and amplifying voltage differences read out from memory cells, different from a second value of substrate bias voltage, of transistors of said memory cells, and different from a third value of substrate bias voltage, of transistors of peripheral circuits other than said sense amplifier circuits, said third bias voltage being different from said second bias voltage;
in which said transistors are in p-type wells, and in which said first bias voltage is higher than both of said second and third bias voltages.

13. A semiconductor memory apparatus including metal-oxide-silicon field effect transistors, and means for making a first value of substrate bias voltage, of transistors of sense amplifier circuits for detecting and amplifying voltage differences read out from memory cells, different from a second value of substrate bias voltage, of transistors of said memory cells, and different from a third value of substrate bias voltage, of transistors of peripheral circuits other than said sense amplifier circuits, said third bias voltage veing different from said second bias voltage;
in which said transistors are in n-type wells, and in which said first bias voltage is lower than both of said second and third bias voltages.

14. A semiconductor memory apparatus according to claim 3, wherein said respective p-type wells are within an n-type substrate.

15. A semiconductor memory apparatus according to claim 3, wherein said respective p-type wells are within n-type wells.

16. A semiconductor memory apparatus according to claim 4, wherein said respective n-type wells are within a p-type substrate.

17. A semiconductor memory apparatus according to claim 4, wherein said respective n-type wells are within p-type wells.

18. A semiconductor memory apparatus according to claim 6, wherein said respective p-type wells are within an n-type substrate.

19. A semiconductor memory apparatus according to claim 6, wherein said respective p-type wells are within n-type wells.

20. A semiconductor memory apparatus according to claim 7, wherein said respective n-type wells are within a p-type substrate.

21. A semiconductor memory apparatus according to claim 7, wherein said respective n-type wells are within p-type wells.

22. A semiconductor memory apparatus according to claim 8, wherein said n-type wells are within a p-type semiconductor material and said p-type wells are within an n-type semiconductor material.

23. A semiconductor memory apparatus according to claim 9, wherein said n-type wells are within a p-type semiconductor material and said p-type wells are within an n-type semiconductor material.

* * * * *